United States Patent
Grille et al.

(10) Patent No.: US 10,005,659 B2
(45) Date of Patent: Jun. 26, 2018

(54) METHOD FOR SIMULTANEOUS STRUCTURING AND CHIP SINGULATION

(71) Applicant: Infineon Technologies AG, Neubiberg (DE)

(72) Inventors: Thomas Grille, Villach (AT); Ursula Hedenig, Villach (AT); Michael Roesner, Villach (AT); Gudrun Stranzl, Goedersdorf (AT); Martin Zgaga, Rosegg (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/440,962

(22) Filed: Feb. 23, 2017

(65) Prior Publication Data

US 2017/0158493 A1    Jun. 8, 2017

Related U.S. Application Data (62) Division of application No. 14/170,187, filed on Jan. 31, 2014, now Pat. No. 9,610,543.

(51) Int. Cl.
*B81B 7/00* (2006.01)
*B01D 67/00* (2006.01)
*B81C 1/00* (2006.01)

(52) U.S. Cl.
CPC ........ *B81B 7/0061* (2013.01); *B01D 67/0034* (2013.01); *B81C 1/00904* (2013.01); *B81B 2201/0257* (2013.01); *B81C 2201/0132* (2013.01)

(58) Field of Classification Search
CPC ............ B81C 1/00666; B81C 1/00904; B81B 7/0061; B01D 67/0034
See application file for complete search history.

(56) References Cited

U.S. PATENT DOCUMENTS

| | | | |
|---|---|---|---|
| 6,521,513 | B1 | 2/2003 | Lebens et al. |
| 8,507,363 | B2 | 8/2013 | Lei et al. |
| 8,778,738 | B1 | 7/2014 | Lin et al. |
| 2006/0043533 | A1 | 3/2006 | Lake |
| 2008/0070379 | A1 | 3/2008 | Kikuchi |
| 2008/0087634 | A1 | 4/2008 | Kohsaka et al. |
| 2008/0123876 | A1* | 5/2008 | Sato ............. H04R 19/016 381/174 |
| 2011/0124156 | A1 | 5/2011 | Do et al. |
| 2011/0312157 | A1 | 12/2011 | Lei et al. |

(Continued)

OTHER PUBLICATIONS

Ji, H., et al., "Silicon-based microfilters for whole blood cell separation," Biomedical Microdevices, Apr. 2008, pp. 1-2, vol. 10, Issue 2, Springer US, http://www.springerimages.com/Images/Engineering/1-10.1007_s10544-007-9131-x-1.

(Continued)

*Primary Examiner* — Dung Le
(74) *Attorney, Agent, or Firm* — Slater Matsil, LLP (57) ABSTRACT

A hole plate and a MEMS microphone arrangement are disclosed. In an embodiment a hole plate includes a substrate with a first main surface, a second main surface, and a lateral surface and a perforation structure formed within the substrate, the perforation structure having a plurality of through-holes through the substrate, wherein the through-holes and the lateral surface are a result of a simultaneous dry etching step.

20 Claims, 7 Drawing Sheets

(56) References Cited

U.S. PATENT DOCUMENTS

| | | | |
|---|---|---|---|
| 2012/0082325 A1* | 4/2012 | Sakurauchi | B81C 1/00666 |
| | | | 381/174 |
| 2012/0146163 A1* | 6/2012 | Ho | B81C 1/0023 |
| | | | 257/416 |
| 2013/0267076 A1 | 10/2013 | Lei et al. | |
| 2013/0270658 A1 | 10/2013 | Behrendt et al. | |
| 2014/0117469 A1 | 5/2014 | Takahashi et al. | |

OTHER PUBLICATIONS

Vogler, D., "AMAT accelerating TSV implementation, launches Silvia etch tool," Solid State Technology Insights for Electronics Manufacturing, Dec. 1, 2008, pp. 1-3. http://electroiq.com/blog/2008/12/amat-accelerating-tsv-implementation-launches-silvia-etch-tool/.

* cited by examiner

METHOD FOR SIMULTANEOUS STRUCTURING AND CHIP SINGULATION

CROSS-REFERENCE TO RELATED APPLICATIONS

This application is a divisional of U.S. patent application Ser. No. 14/170,187, filed Jan. 31, 2014, and entitled "Method for Simultaneous Structuring and Chip Singulation," which application is incorporated herein by reference.

TECHNICAL FIELD

Embodiments of the present invention relate to a method that may be used in semiconductor device fabrication. Some embodiments relate to a method for simultaneous structuring and damage-free separation of membrane filter. Further embodiments relate to a hole plate, in particular a semiconductor-based hole plate to be used in connection with a MEMS microphone. Further embodiment relate to a MEMS microphone or a MEMS microphone arrangement.

BACKGROUND

It is possible to manufacture miniature hole plates, membrane filters, weir filters, and similar structures by means of semiconductor manufacturing-based processes, such as lithography and etching. These miniature structures or elements may be used as fluid filters, for example.

For the manufacturing of membrane filters from thin semiconductor or glass wafers, e.g., from Si (silicon) wafers for e.g. MEMS applications (MEMS: micro electro-mechanical system), the structuring of the filter membrane may be done by, for example, wet chemical etching or dry etching before or after the filter separation process. The filter separation process is also known as "dicing" or "singulation". As the handling of the structured semiconductor filter membrane is somewhat critical and delicate, the separation process may be done by separate dicing techniques (e.g., mechanical dicing, laser dicing, stealth dicing) before or after the structuring of the filter membrane. This separation processes might cause either mechanical damage, e.g., chipping, or amorphization/mechanical stresses of the bulk semiconductor or glass at the filter edges which will deteriorate the mechanical stability of the membrane leading to a significant decrease in their mechanical breaking strength.

Especially when the bulk semiconductor is relatively thin (for example, mourn or below), damage-free dicing becomes increasingly difficult. Indeed, the breaking strength typically is a quadratic function of the substrate thickness so that the probability of fracture increases significantly with decreasing thickness.

SUMMARY

In accordance with an embodiment of the present invention a method comprises: providing a substrate with a first main surface and a second main surface, wherein the substrate is fixed to a carrier arrangement at the second main surface. The method further comprises performing a photolithography step at the first main surface of the substrate to mark a plurality sites at the first main surface, the plurality of sites corresponding to future perforation structures and future kerf regions for a plurality of future individual semiconductor chips to be obtained from the substrate. The method also comprises plasma etching the substrate at the plurality of sites until the carrier arrangement is reached, thus creating the perforation structures within the plurality of individual semiconductor chips and simultaneously separating the individual semiconductor chips along the kerf regions.

In accordance with another embodiment of the present invention a hole plate comprises a substrate with a first main surface, a second main surface, and a lateral surface. The hole plate also comprises a perforation structure formed within the substrate, the perforation structure comprising a plurality of through-holes through the substrate. The through-holes and the lateral surface are a result of a simultaneous dry etching step.

In accordance with yet another embodiment of the present invention a MEMS microphone arrangement comprises a MEMS microphone having a membrane that is suspended across a chip cavity formed within a semiconductor chip of the MEMS microphone. The MEMS microphone arrangement further comprises a hole plate comprising a substrate, the hole plate being attached to the semiconductor chip across the chip cavity. The hole plate comprises a plurality of through-holes and a lateral surface, the through-holes and the lateral surface being a result of a simultaneous dry etching step during a manufacturing of the hole plate.

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

When performing a process sequence consisting of subsequent filter structuring and filter separation steps, in particular those filter separation steps that are based on mechanical dicing technology or laser dicing technology may result in relatively high stress to occur on the filter edges leading to decreased mechanical breaking strength and to limitation of the applications of these structurally weakened filter membranes.

Instead of performing the structuring and separation of semiconductor or glass filter membranes sequentially and using different manufacturing technologies, it is proposed to perform both steps substantially simultaneously and using the same manufacturing technology. The simultaneous structuring and separation of the semiconductor or glass filter membranes by a dry plasma etching process, e.g., DRIE (Deep Reactive Ion Etching dry etch process), typically leads to substantially damage free filter structuring and filter separation without mechanical chipping or sidewall amorphization/mechanical stresses. By application of, e.g., plasma dicing after grinding, the structuring of the filter may be done by a lithographic step which includes the separation of the filter membrane. By utilization of customized lithographic mask kerf patterns also non-rectangular outer filter shapes (e.g., circular or hexagonal shapes) and customized filter opening geometries (e.g., circles, hexagons, triangles etc.) may be produced. By use of a suitable substrate, e.g., a glass carrier, very thin free standing semiconductor or glass membranes can be mass produced on different wafer sizes, e.g., 6", 8" or 12". The semiconductor or glass membranes may be mounted on a thin adhesive tape for transport and storage and may be picked up at the assembly site by a pick-up process for the subsequent assembly and integration of the filter membrane into the application device.

FIGS. 1A to 1G schematically illustrate process flow examples of the proposed method for simultaneous structuring and separation of a filter (pictures are not drawn to scale). These process flow examples can be adopted to almost any filter membrane geometry and any etching process for simultaneous structuring and separation of thin semiconductor or glass filters. In particular, FIGS. 1A to 1G show schematic cross sections of a process flow for simultaneous filter structuring and separation with plasma dicing after grinding.

Figure 1A:
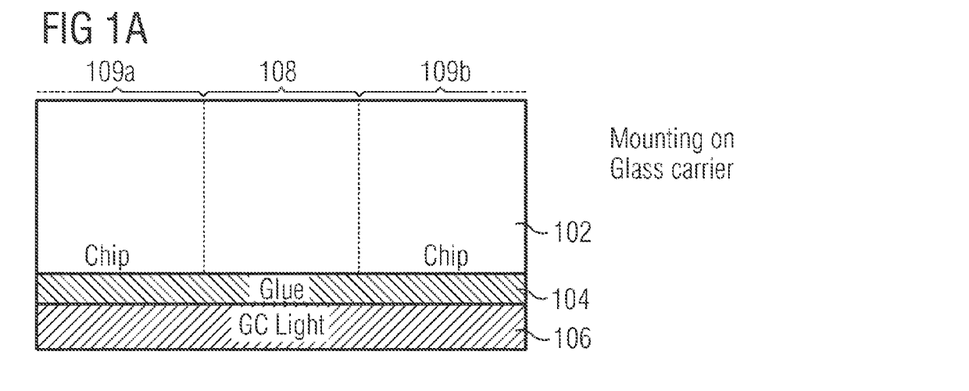
FIGS. 1A to 1G schematically illustrate a process for simultaneous structuring and chip separation.

FIG. 1A shows a schematic cross section of a portion of a substrate 102 after it has been mounted on a glass carrier 106. The substrate 102 may be a semiconductor substrate, for example silicon. Alternatively, the substrate may be glass substrate. Other materials, for example anorganic materials or crystalline materials, may also be possible for the substrate 102. The substrate 102 may in particular be a wafer or a portion of a wafer. The substrate 102 is mounted on the glass carrier 106 using a glue 104 or adhesive. The glass carrier 106 forms a carrier arrangement, or is a part of a carrier arrangement that stabilizes the substrate 102 during the subsequent process steps and/or makes the handling of the substrate 102 possible.

The portion of the substrate shown in FIG. 1A comprises a portion of a first chip 109a and a portion of a neighboring chip 109b. The first and second chips 109a, 109b are separated by a future kerf region 108. The kerf region 108 is also called "scribeline". The glue 104 is depicted thicker in the kerf region 108, but this is not necessarily so. In particular, the substrate 102 may comprise a recess at a second main surface of the substrate 102. The second main surface is the main surface of the substrate 102 that is in contact with the glue 104. The substrate 102 also comprises a first main surface opposite to the second main surface, i.e., the "upper surface" according to the direction the substrate is drawn in FIG. 1A. It should be noted that the orientation of the substrate typically is not important for performing the proposed method, although exceptions to this rule may be possible.

Figure 1B:
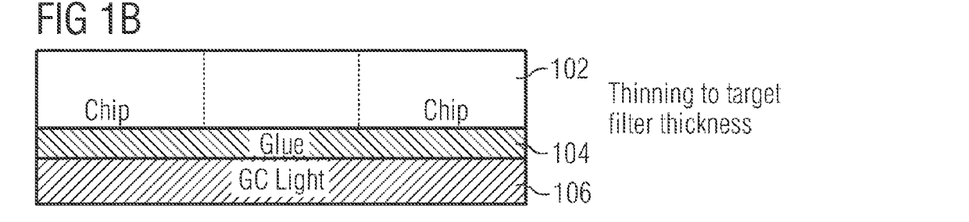

FIG. 1B shows the substrate 102 after a thinning process has been performed in order to bring the substrate 102 to a target thickness. The target thickness may be the desired thickness of future membrane filters that may be manufactured by the proposed method. Thinning may be based on a grinding step or on an etching step, or a combination of grinding and etching. Other technologies for wafer thinning may also be employed. The thickness of the substrate 102 after thinning may be less than 100 µm, for example 50 µm.

Figure 1C:
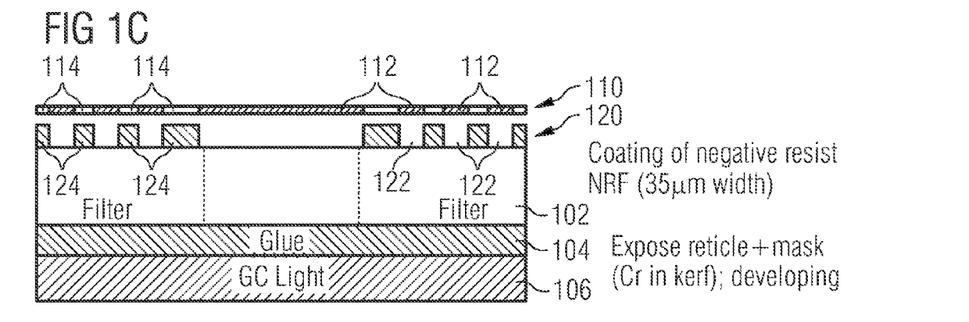

In FIG. 1C a photoresist 120 has been coated to the first main surface of the substrate 102. The photoresist 120 may be a negative photoresist (for example NFR) with a thickness between 10 µm and 50 µm, for example 35 µm. A positive photoresist is in principle also possible. A photolithography mask or reticle no is illustrated in FIG. 1C for exposing selected portions of the photoresist to light, typically ultraviolet light. The photolithography mask 110 comprises a plurality of transparent regions 112 and a plurality of opaque regions 114. The opaque regions 114 may comprise chromium (Cr). The photoresist 120 is exposed within regions 122 where the photolithography mask no comprises the transparent regions 112. The photoresist 120 is not exposed within regions 124 where the photolithography mask 110 comprises the opaque regions 114. The photoresist 120 is then developed and selectively dissolved so that the unexposed regions 122 are removed and the exposed regions 124 are preserved. The photolithography mask no is opaque in the future kerf region 108 so that the photoresist is removed in this region, too.

Figure 1D:
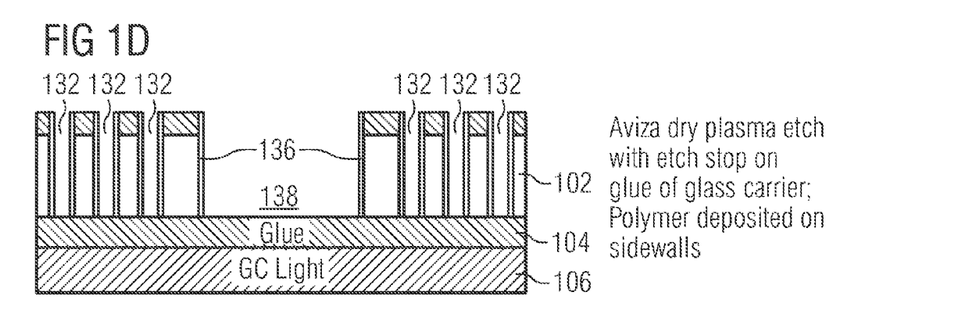

FIG. 1D shows a schematic cross section of the substrate 102 and the carrier arrangement after a plasma etch step has been performed. The plasma etch may be a deep reactive ion etching (DRIE), a Bosch process, etc. The plasma etch step is performed until the glue 104 is reached. The glue 104 may serve as an etch stop. The plasma etch removes the substrate in a substantially anisotropic manner at the sites that are not protected by the photoresist 120. In the future kerf region 108 the photoresist 120 was also removed so that the plasma etch step also acts on the surface of the semiconductor substrate 102 in the future kerf region 108. When the plasma etch step is finished, the kerf region 138 is obtained. The two chips 109a and 109b are now effectively separated, with only the carrier arrangement temporarily binding the two chips 109a, 109b together (as well as all the other chips that are usually formed simultaneously on a wafer). Simultaneously with the formation of the kerf region 138, a plurality of through-holes 132 has been formed in the substrate 102 by means of the plasma etch step FIG. 1D shows as an example the result of an Aviza dry plasma etch step. The Aviza dry plasma etch technology deposits a polymer 132 on sidewalls of the cavity formed during the etching. This polymer 132 acts as a protective coating for the sidewalls while the plasma etching continues.

Figure 1E:
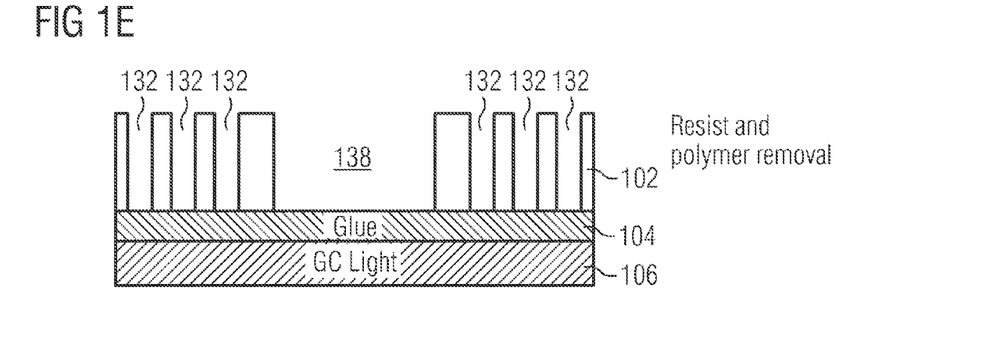

In FIG. 1E the photoresist 120 and the polymer 132 have been removed, for example by means of a solvent. See FIG. 2 for a corresponding schematic perspective view.

Figure 1F:
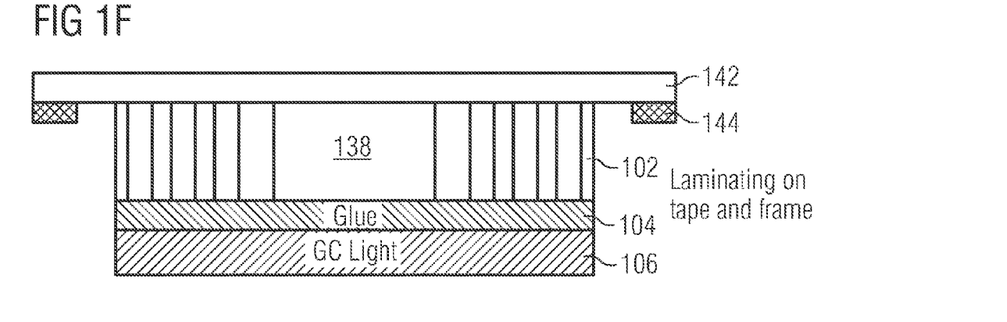

FIG. 1F shows the substrate 102 after it has been laminated on a tape 142. The tape 142 is supported by a frame 144. Lamination may be assisted by ultraviolet light or laser in order to activate an adhesive at a surface of the tape 142.

Figure 1G:
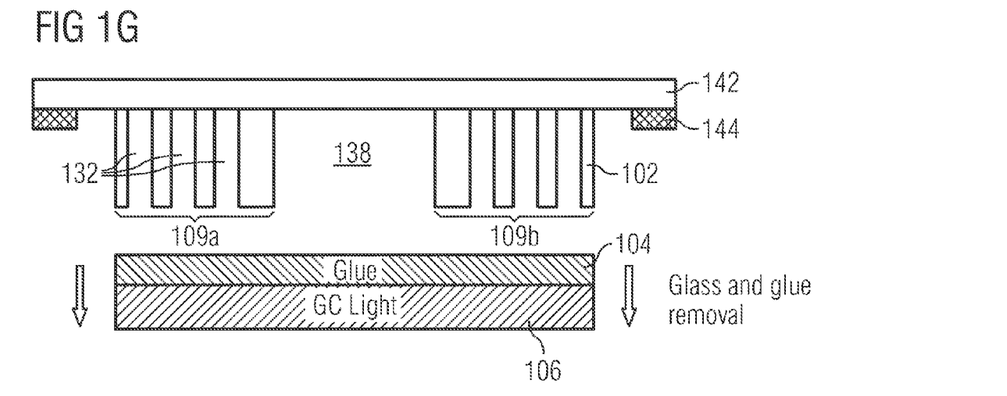

The glass carrier 106 and the glue 104 may then be removed by lifting the tape 142 together with the substrate 102 adhered to it, as schematically illustrated in FIG. 1G. The chips 109a and 109b are separated, but may still be handled together due to the tape 142 and the frame 144. In particular, it is possible to transport the plurality of already separated chips that has been obtained from one wafer to a pick-and-place tool for assembly and integration of the chips 109a, 109b and further chips into the application device. Detaching the chips 109a, 109b from the glue 104 may be assisted chemically by a suitable solvent or optically by using a laser.

Figure 2:
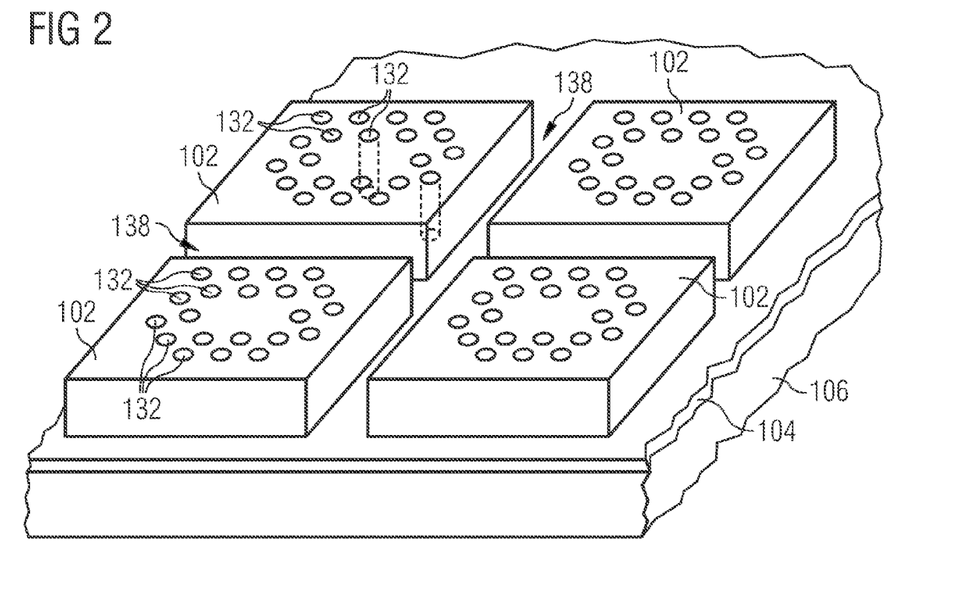
FIG. 2 shows a schematic perspective view of a semiconductor wafer after perforation structures and kerf regions have been formed via plasma etching.

FIG. 2 shows a schematic perspective view of four (out of many, typically) separated substrates 102 that are still attached to the glue 104. Hence, FIG. 2 corresponds substantially to FIG. 1E. The through-holes 132 and also the kerf regions 138 can be seen. The through-holes in each substrate 102 form a perforation structure. The perforation structures are substantially ring-shaped.

Figure 3:
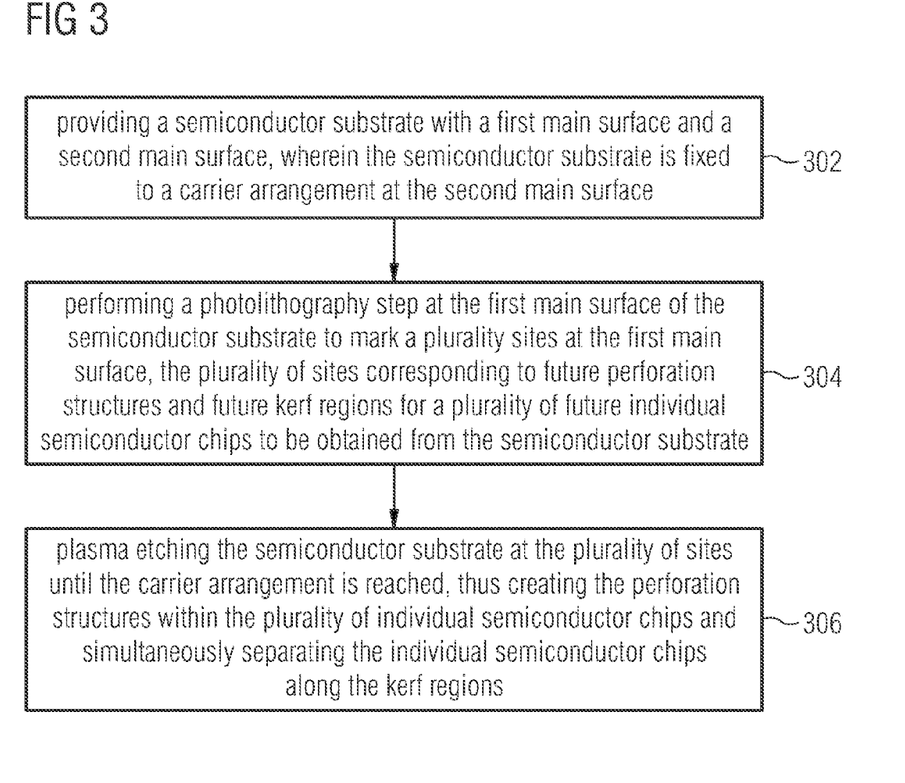
FIG. 3 shows a schematic flow diagram of a method for simultaneous structuring and separation.

FIG. 3 shows a schematic flow diagram of a method as proposed herein. The method comprises a step 302 of providing a substrate with a first main surface and a second main surface, wherein the substrate is fixed to a carrier arrangement at the second main surface. The method further comprises a step 304 of performing a photolithography step at the first main surface of the substrate to mark a plurality sites at the first main surface, the plurality of sites corresponding to future perforation structures and future kerf regions for a plurality of future individual semiconductor chips to be obtained from the substrate. The method also comprises a step 306 of plasma etching the substrate at the plurality of sites until the carrier arrangement is reached, thus creating the perforation structures within the plurality of individual semiconductor chips and simultaneously separating the individual semiconductor chips along the kerf regions.

The proposed method typically yields substantially stress-free substrates after the separation step. Furthermore, the proposed method avoids mechanically sawing the wafer or laser dicing. Mechanically sawing the wafer in order to separate the individual chips from each other typically results in the creation of stress along the lateral surfaces of the eventual chips. Sawing may result in that a previously substantially mono-crystalline structure is transformed to a poly-crystalline structure. Laser dicing typically creates melting zones in the vicinity of the kerf region, which may again lead to the formation of polycrystalline structures.

The carrier arrangement may comprise a glass carrier and a glue layer. The method may further comprise a step of thinning the substrate at the first main surface prior to performing the photolithography step.

The plurality of separated semiconductor chips may be adhered to a tape at their first surfaces after the plasma etching. Subsequently, the carrier arrangement may be removed.

The plasma etching may comprise at least one of a reactive ion etch process (RIE), a deep reactive ion etching dry etch (DRIE) process and a Bosch process.

The carrier arrangement may serve as an etch stop for the plasma etching.

At least one of the plurality of individual semiconductor chips may be bounded by a non-rectangular kerf region. For example, circular, triangular, hexagonal, or octagonal shapes may be obtained. This may be in particular useful if the chips produced by the proposed method are filter membranes that are inserted in conduits or tubes having a certain cross-sectional shape.

The plurality of individual semiconductor chips may comprise at least one of membrane filters, sieves, grids, hole plates, and pressure impulse attenuators.

The perforation structure may comprise a plurality of through-holes through the semiconductor arrangement arranged in a circumferential pattern around an unperforated region 452 (see FIGS. 4A to 4H) of each semiconductor chip. In this manner, it can be prevented that a fluid passes the perforation arrangement in a central region of a total available cross section. In particular if the perforation structure is intended to act as a pressure reducer for pressure impulses, the unperforated central region prevents that the pressure impulse traverses the perforation via a direct path.

At least one of the semiconductor chips may form a pressure attenuating hole plate for a microphone. The perforation structure may comprise at least one through-hole located at a position aligned with a suspension arrangement of a membrane of the microphone. In case a pressure impulse passes through the hole plate, the positioning of the through holes 132 may cause the pressure impulse to hit the suspension arrangements of the membrane, rather than a free, suspended membrane portion. As a result, the membrane is deflected by the pressure impulse in a relatively weak manner only so that a risk of damage to the membrane can be significantly reduced. On the other hand, actual sound waves to be sensed by the microphone can still reach the membrane and cause the membrane to oscillate, despite the presence of the hole plate.

The substrate may have a thickness less than 100 µm when the plasma etching starts. A maximal mechanical stress within the substrate of separated semiconductor chips after the plasma etching may be less than 50 MPa (alternatively less than 40 MPa, 30 MPa, 20 MPa, 10 MPa, . . . ), which typically is beneficial for improving the mechanical breaking strength.

Figure 4A:
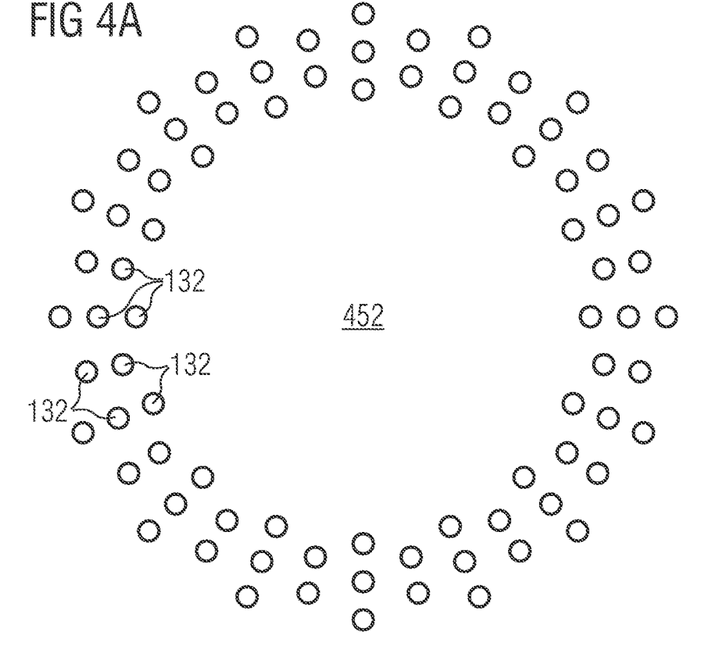
FIGS. 4A to 4H show top views of different perforation structure layouts.
Figure 4B:
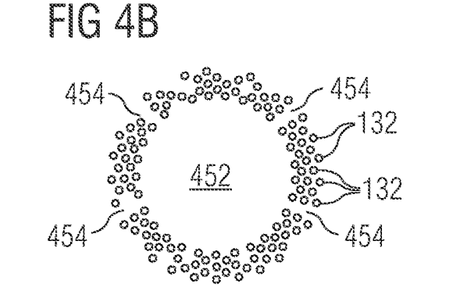
Figure 4C:
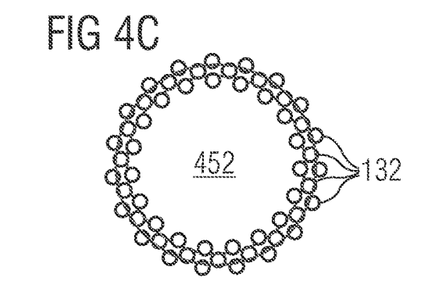
Figure 4D:
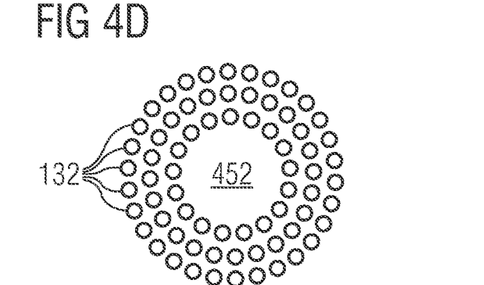
Figure 4E:
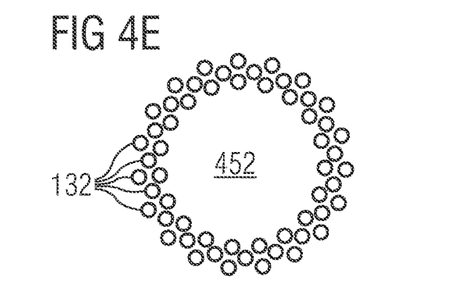
Figure 4F:
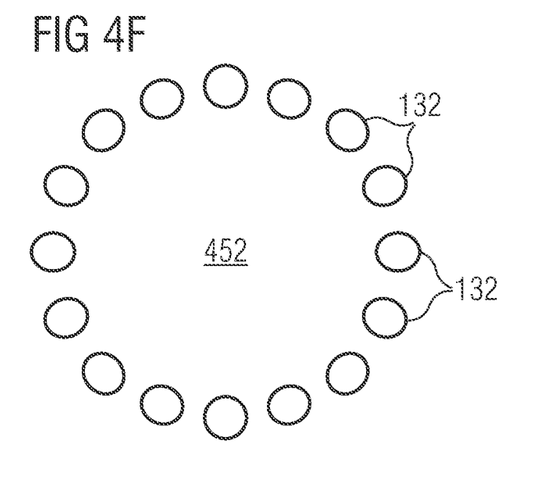
Figure 4G:
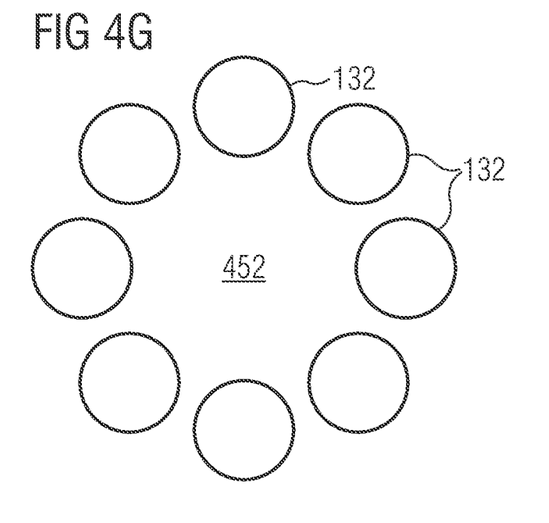

FIGS. 4A to 4H show top views of different possible layouts of the perforation structure and of the corresponding through-holes 132. These layouts may be in particular used for hole plates in microphones and/or loudspeakers. Reference numeral 452 designates a central portion in which no through-holes 132 are located, for reasons explained above. FIG. 4B further illustrates arms 454 in which no through-holes 132 are present. The four arms in FIG. 4B support the central region 452. Note that two neighboring through-holes 132 are typically spaced apart by a distance that is larger than the diameter of the through-holes 132 so that substrate material exists between the through-holes 132. In this manner, the central portion 452 can be supported.

Figure 4H:
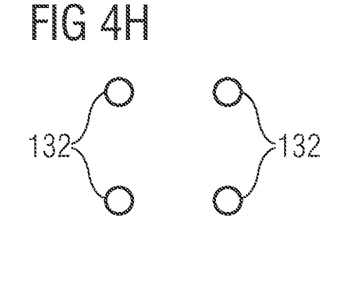

In particular, FIG. 4H shows a layout of a hole plate comprising four through-holes 132 arranged in a rectangular pattern, more precisely a square pattern. This hole plate may be used, for example, in connection with a MEMS microphone that has a square layout, as well. For example, some MEMS microphones have a square layout of the membrane and the membrane is supported at the corners of the square. The four through-holes 132 in FIG. 4H correspond to the four corners of the square membrane layout. Furthermore, the membrane may be driven by so called electrostatic comb drives that are arranged along the sides of the square membrane.

Another possible layout of the perforation structure may be substantially rectangular or square with rounded corners. In particular, the circumferential portion in which a plurality of through-holes 132 are arranged (for example, more than 10 holes) may have the described rectangular or square shape with rounded corners.

Figure 5:
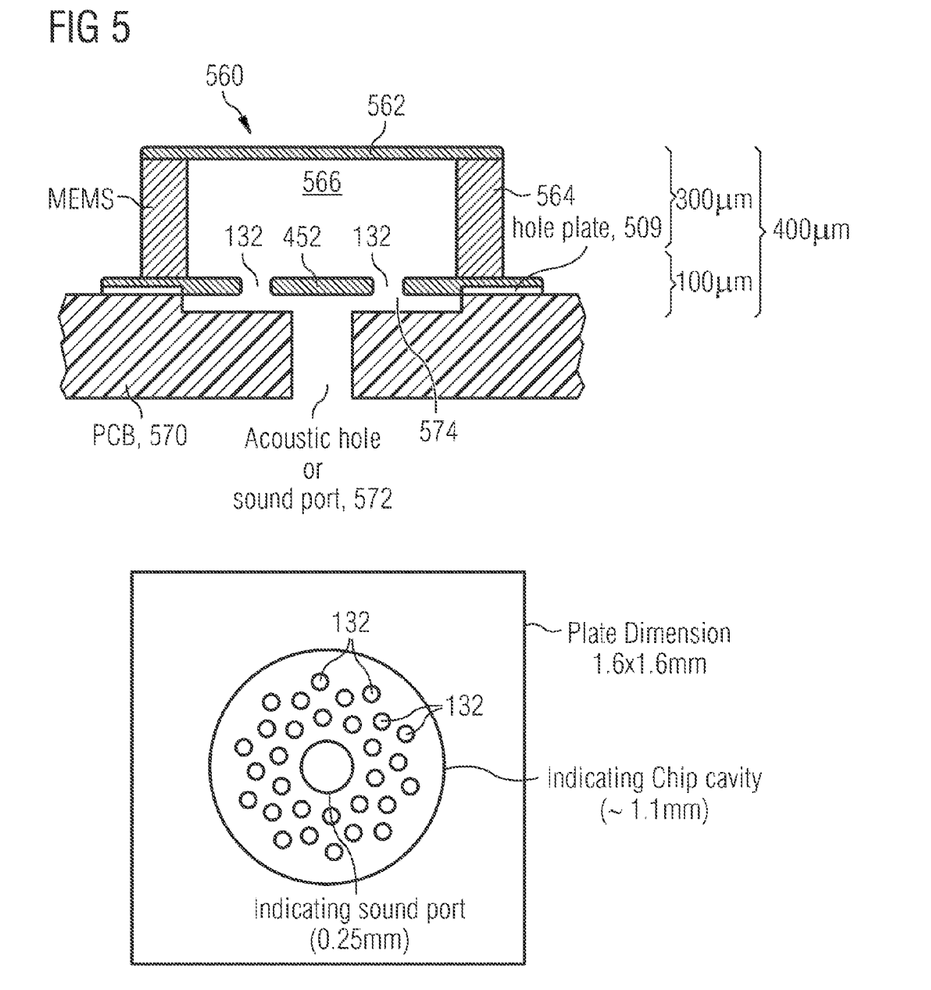
FIG. 5 shows a schematic cross section through a MEMS microphone arrangement and a schematic top view of the corresponding hole plate.

FIG. 5 shows a schematic cross section of a MEMS microphone arrangement and a top view of a corresponding hole plate 509. The MEMS microphone arrangement comprises the MEMS microphone 560 per se and the hole plate 509. The MEMS microphone arrangement is mounted on a printed circuit board (PCB) 570. In some embodiments, the PCB or a portion thereof may be a part of the MEMS microphone arrangement.

The MEMS microphone 560 is represented in a simplified manner and comprises a membrane 562, a microphone substrate 564, and a chip cavity 566. The chip cavity 566 is open to a sound port 574 formed within the PCB 570.

The hole plate 509 is arranged between the PCB 570 and the microphone substrate 564. The central portion 452 obstructs the direct connection between the sound port 572 and the chip cavity 566. The through-holes 132 are arranged radially outside the central portion 452. Hence, the through-holes 132 are not located within central portion of the chip cavity 566.

As mentioned before, a portion of the PCB 570 may be considered as a part of the MEMS microphone arrangement. This portion of the PCB 570 may provide a base structure for the MEMS microphone arrangement. The hole plate 509 may be arranged between the base structure 570 and the semiconductor chip 564. The base structure 570 may comprise the sound port 572 that is smaller than the chip cavity 566 and aligned with the chip cavity 566. The base structure 570 may further comprise a recess or conduit 574 at a surface facing the hole plate 590, wherein the recess 574 connects the sound port 572 with the through-holes 132 to provide a passage for sound waves from the sound port 572 to the through-holes 132.

The microphone substrate 564 may have a thickness $d_1$ between 200 µm and 1000 µm, for example 300 µm. The hole plate 509 may have a thickness $d_2$ between 300 µm and 300 µm, for example 100 µm. The lateral plate dimensions of the hole plate 509 may be between 0.7 mm and 3 mm, for example 1.6 mm×1.6 mm. The chip cavity 566 may have a diameter or width between 0.5 mm and 2 mm, for example 1.1 mm. The sound port 572 may have a diameter or width between 0.1 mm and 1 mm, for example 0.25 mm.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A MEMS microphone arrangement comprising:
   a MEMS microphone having a membrane that is suspended across a chip cavity formed within a semiconductor chip of the MEMS microphone;
   a hole plate comprising a substrate, the hole plate being attached to the semiconductor chip across the chip cavity, wherein the hole plate comprises a plurality of through-holes and a lateral surface, the through-holes and the lateral surface being a result of a simultaneous dry etching step during manufacturing of the hole plate, and wherein the through-holes are not located within a central portion of the chip cavity; and
   a base structure comprising a sound port that is smaller than the chip cavity and aligned with the chip cavity and a recess at a surface facing the hole plate, wherein the recess connects the sound port with the through-holes to provide a passage for sound waves from the sound port to the through-holes, and
   wherein the hole plate is arranged between the base structure and the semiconductor chip.

2. A MEMS microphone arrangement comprising:
   a MEMS microphone having a membrane that is suspended across a chip cavity formed within a semiconductor chip of the MEMS microphone;
   a hole plate comprising a substrate, the hole plate being attached to the semiconductor chip across the chip cavity, wherein the hole plate comprises a plurality of through-holes and a lateral surface, and wherein the through-holes are not located within a central portion of the chip cavity; and
   a base structure comprising a sound port that is smaller than the chip cavity and aligned with the chip cavity and a recess at a surface facing the hole plate, wherein the recess connects the sound port with the through-holes to provide a passage for sound waves from the sound port to the through-holes, and
   wherein the hole plate is arranged between the base structure and the semiconductor chip.

3. The MEMS microphone arrangement according to claim 2, wherein the base structure is a printed circuit board.

4. The MEMS microphone arrangement according to claim 2, wherein the hole plate is a semiconductor substrate.

5. The MEMS microphone arrangement according to claim 4, wherein the semiconductor substrate is silicon.

6. The MEMS microphone arrangement according to claim 2, wherein the hole plate is a glass substrate.

7. The MEMS microphone arrangement according to claim 2, wherein the hole plate has a thickness of 30 µm to 300 µm, while the MEMS microphone has a thickness of 200 µm to 1000 µm.

8. The MEMS microphone arrangement according to claim 2, wherein lateral dimensions of the hole plate are larger than lateral dimensions of the chip cavity.

9. The MEMS microphone arrangement according to claim 2, wherein the through holes are further separated by four arms.

10. The MEMS microphone arrangement according to claim 2, wherein the through-holes are at least four through-holes.

11. The MEMS microphone arrangement according to claim 2, wherein a distance between two neighboring through-holes is larger than diameters of the two neighboring through-holes.

12. A MEMS microphone arrangement comprising:
    a MEMS microphone having a membrane that is suspended across a chip cavity formed within a semiconductor chip of the MEMS microphone;
    a hole plate comprising a substrate, the hole plate being attached to the semiconductor chip across the chip cavity, wherein the hole plate comprises a plurality of through-holes and a lateral surface; and
    a base structure comprising a sound port that is smaller than the chip cavity and aligned with the chip cavity and a recess at a surface facing the hole plate, wherein the recess connects the sound port with the through-holes to provide a passage for sound waves from the sound port to the through-holes, and
    wherein the hole plate is arranged between the base structure and the semiconductor chip.

13. The MEMS microphone arrangement according to claim 12, wherein the base structure is a printed circuit board.

14. The MEMS microphone arrangement according to claim 12, wherein the hole plate is a semiconductor substrate.

15. The MEMS microphone arrangement according to claim 14, wherein the semiconductor substrate is silicon.

16. The MEMS microphone arrangement according to claim 12, wherein the hole plate is a glass substrate.

17. The MEMS microphone arrangement according to claim 12, wherein the hole plate has a thickness of 30 μm to 300 μm, while the MEMS microphone has a thickness of 200 μm to 1000 μm.

18. The MEMS microphone arrangement according to claim 2, wherein the hole plate comprises a circumferential portion surrounding the central portion, the through-holes being located in the circumferential portion.

19. The MEMS microphone arrangement according to claim 18, wherein the central portion is circular and the circumferential portion is ring-shaped.

20. The MEMS microphone arrangement according to claim 18, wherein the central portion has a rectangular shape with rounded corners.

* * * * *